United States Patent
Li et al.

(10) Patent No.: US 6,327,176 B1
(45) Date of Patent: Dec. 4, 2001

(54) SINGLE EVENT UPSET (SEU) HARDENED LATCH CIRCUIT

(75) Inventors: Bin Li, Fairfax; David C. Lawson, Fredericksburg, both of VA (US)

(73) Assignees: Systems Integration Inc.; BAE Systems Information and Electronic, both of Rockville, MD (US)

( * ) Notice: Subject to any disclaimer, the term of this patent is extended or adjusted under 35 U.S.C. 154(b) by 0 days.

(21) Appl. No.: 09/844,079

(22) Filed: Apr. 26, 2001

Related U.S. Application Data

(60) Provisional application No. 60/224,649, filed on Aug. 11, 2000.

(51) Int. Cl.$^7$ ................................................. G11C 11/412
(52) U.S. Cl. ........................................... 365/156; 365/154
(58) Field of Search ...................................... 365/156, 154, 365/189.05, 230.08

(56) References Cited

U.S. PATENT DOCUMENTS

| | | | |
|---|---|---|---|
| 5,905,290 | * 5/1999 | Houston | 257/380 |
| 5,940,318 | * 8/1999 | Bessot | 365/154 |
| 6,005,797 | * 12/1999 | Porter et al. | 365/156 |
| 6,111,780 | * 8/2000 | Bertin | 365/154 |
| 6,215,694 | * 4/2001 | Li et al. | 365/156 |

* cited by examiner

*Primary Examiner*—Andrew Q. Tran
(74) *Attorney, Agent, or Firm*—Antony P. Ng; Bracewell & Patterson, L.L.P.

(57) ABSTRACT

A single event upset hardened latch circuit is disclosed. The single event hardened latch circuit includes a first dual-port inverter and a second dual-port inverter. An input is coupled to the first dual-port inverter via a first set of pass gates. The first dual-port inverter is coupled to the second dual-port inverter via a second set of pass gates. The output is connected to the first and second dual-port inverters.

25 Claims, 5 Drawing Sheets

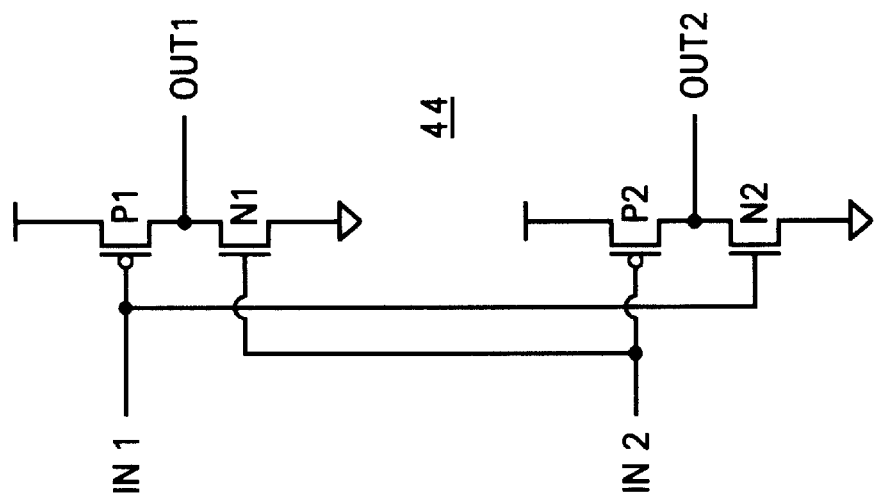
Fig. 5
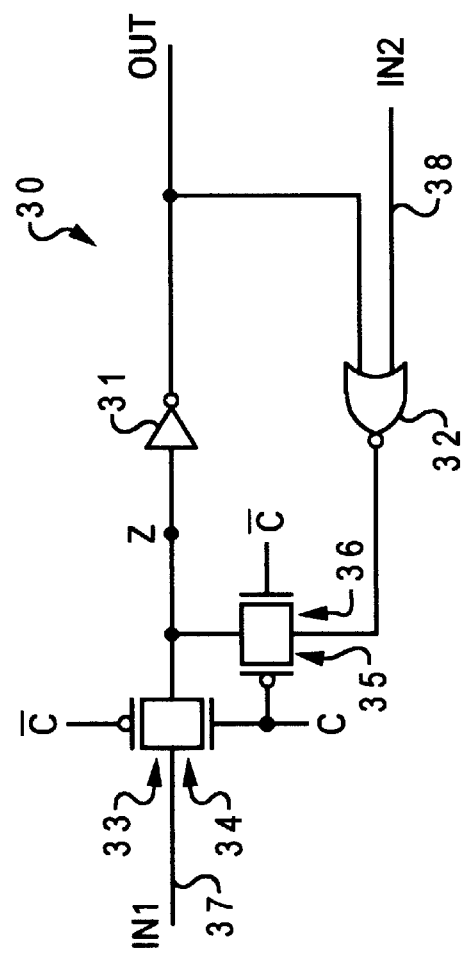
Fig. 3 *Prior Art*

SINGLE EVENT UPSET (SEU) HARDENED LATCH CIRCUIT

CROSS REFERENCE TO A RELATED APPLICATION

The present application claims priority from a provisional application, Ser. No. 60/224,649, filed on Aug. 11, 2000.

BACKGROUND OF THE INVENTION

1. Technical Field

The present invention relates to integrated circuits in general, and in particular to latch circuits. Still more particularly, the present invention relates to a single event upset hardened latch circuit.

2. Description of the Prior Art

Most, if not all, electronic products use latch circuits to store data during data processing operations. Latch circuits are bistable devices having output signals assuming one of two stable states based on a signal level or signal transition of an input signal. Conventional latch circuits include dynamic and static latch circuits. Compared to static latch circuits, dynamic latch circuits typically require less circuitry and operate faster. However, electrical charges stored in dynamic latch circuits tend to dissipate over time through current leakage and thus, dynamic latch circuits disadvantageously require regular charge refresh in order to maintain proper stored signal level. Even though the signal level maintained by static latch circuits do not change over time, standard static latch circuits are still susceptible to single event upsets. Thus, standard static latch circuits may not be very suitable for applications in an environment having high levels of radiation, such as aerospace applications.

An integrated circuit device is said to be radiation hardened if it can continue to function within specifications after exposure to a specified amount of radiation. While it is possible to construct a radiation hardened integrated circuit device with radiation shields in order to achieve the radiation tolerant requirements for aerospace systems, such approach tends to undesirably increase weight, expense, and complexity to the circuit design within such systems. Consequently, it is desirable to provide an improved latch circuit that is radiation hardened to be utilized in high-radiation environments.

SUMMARY OF THE INVENTION

In accordance with a preferred embodiment of the present invention, a single event hardened latch circuit includes a first dual-port inverter and a second dual-port inverter. An input is coupled to the first dual-port inverter via a first set of pass gates. The first dual-port inverter is coupled to the second dual-port inverter via a second set of pass gates. The output is connected to the first and second dual-port inverters.

In accordance with an alternative embodiment of the present invention, a single event hardened latch circuit includes a dual-port inverter for receiving a first input, and a dual-port logic NOR gate for receiving a second input. The first input is coupled to the dual-port inverter via a first set of pass gates. The dual-port logic NOR gate is coupled to the dual-port inverter via a second set of pass gates. An output connected to the dual-port inverter and the dual-port logic NOR gate.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 3 is a schematic diagram of a third latch circuit according to the prior art;

FIG. 5 is a schematic diagram of a dual-port inverter circuit, in accordance with a preferred embodiment of the present invention;

DETAILED DESCRIPTION OF A PREFERRED EMBODIMENT

Figure 1:
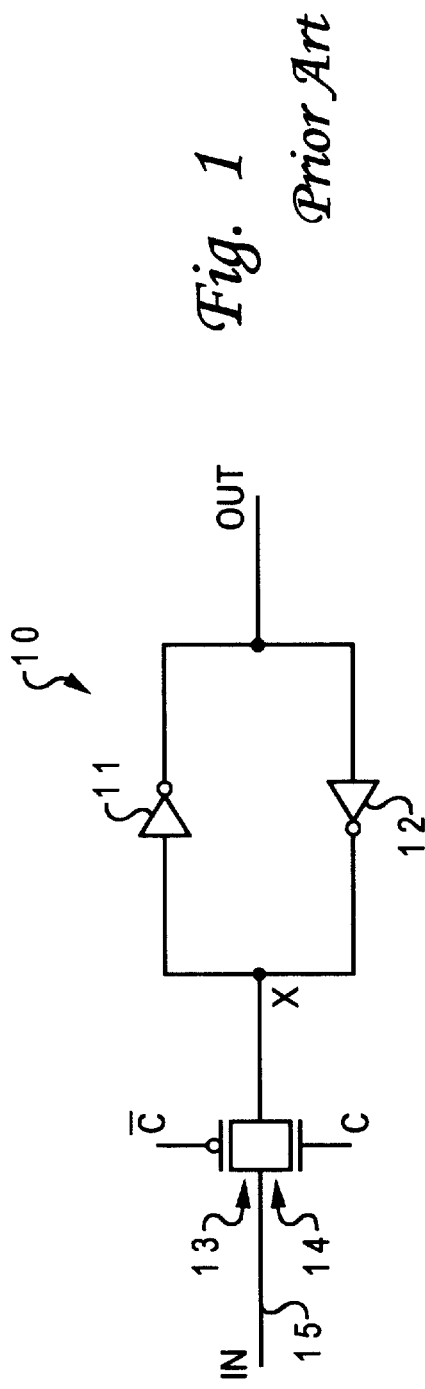
FIG. 1 is a schematic diagram of a first latch circuit according to the prior art.

Referring now to the drawings and in particular to FIG. 1, there is illustrated a schematic diagram of a first latch circuit according to the prior art. As shown, a latch circuit 10 includes inverters 11, 12 and transistors 13, 14. The output of inverter 11 is connected to the input of inverter 12, and the output of inverter 12 is connected to the input of inverter 11. Such configuration allows a data value to be stored at a node x. The data value stored at node x can be changed by turning on transistors 13, 14, which are connected in a pass gate configuration, such that data at input 15 can be transmitted to node x.

Figure 2:
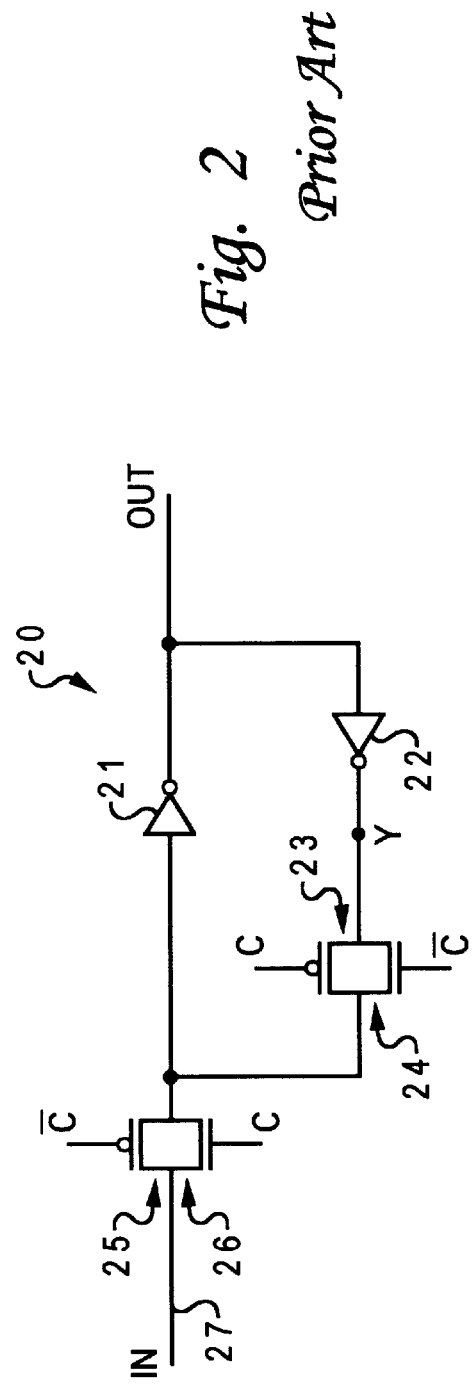
FIG. 2 is a schematic diagram of a second latch circuit according to the prior art.

With reference now to FIG. 2, there is depicted a schematic diagram of a second latch circuit according to the prior art. As shown, a latch circuit 20 includes inverters 21, 22 and transistors 23–26. Similar to latch circuit 10 from FIG. 1, the output of inverter 21 is connected to the input of inverter 22. However, the output of inverter 22 is connected to the input of inverter 11 via transistors 23, 24 that are connected in a pass gate configuration. Such configuration allows a data value to be stored at a node y. The data value stored at node y can be changed by turning on transistors 25, 26 that are connected in a pass gate configuration such that data at input 27 can be transmitted to node y.

Referring now to FIG. 3, there is illustrated a schematic diagram of a two-input latch circuit, according to the prior art. As shown, a latch circuit 30 includes an inverter 31, a logic NOR gate 32, and transistors 33–36. The output of inverter 31 is connected to one of the two inputs of NOR gate 32. The output of NOR gate 32 is connected to the input of inverter 31 via transistors 35, 36 that are connected in a pass gate configuration. An input 37 (IN1) is connected to the input of inverter 31 via transistors 33, 34 that are connected in a pass gate configuration. An input 38 (IN2) is connected to one of the two inputs of NOR gate 32. Such configuration allows a data value to be stored at a node z. The value of node z can be changed by turning on transistors 33–36 such that data at inputs 37 and 38 can be transmitted to node z.

Latch circuits 10, 20, and 30 are susceptible to single event upset (SEU) because a single "hit" at an input line can change the signal level to be stored in those latch circuits.

Figure 4:
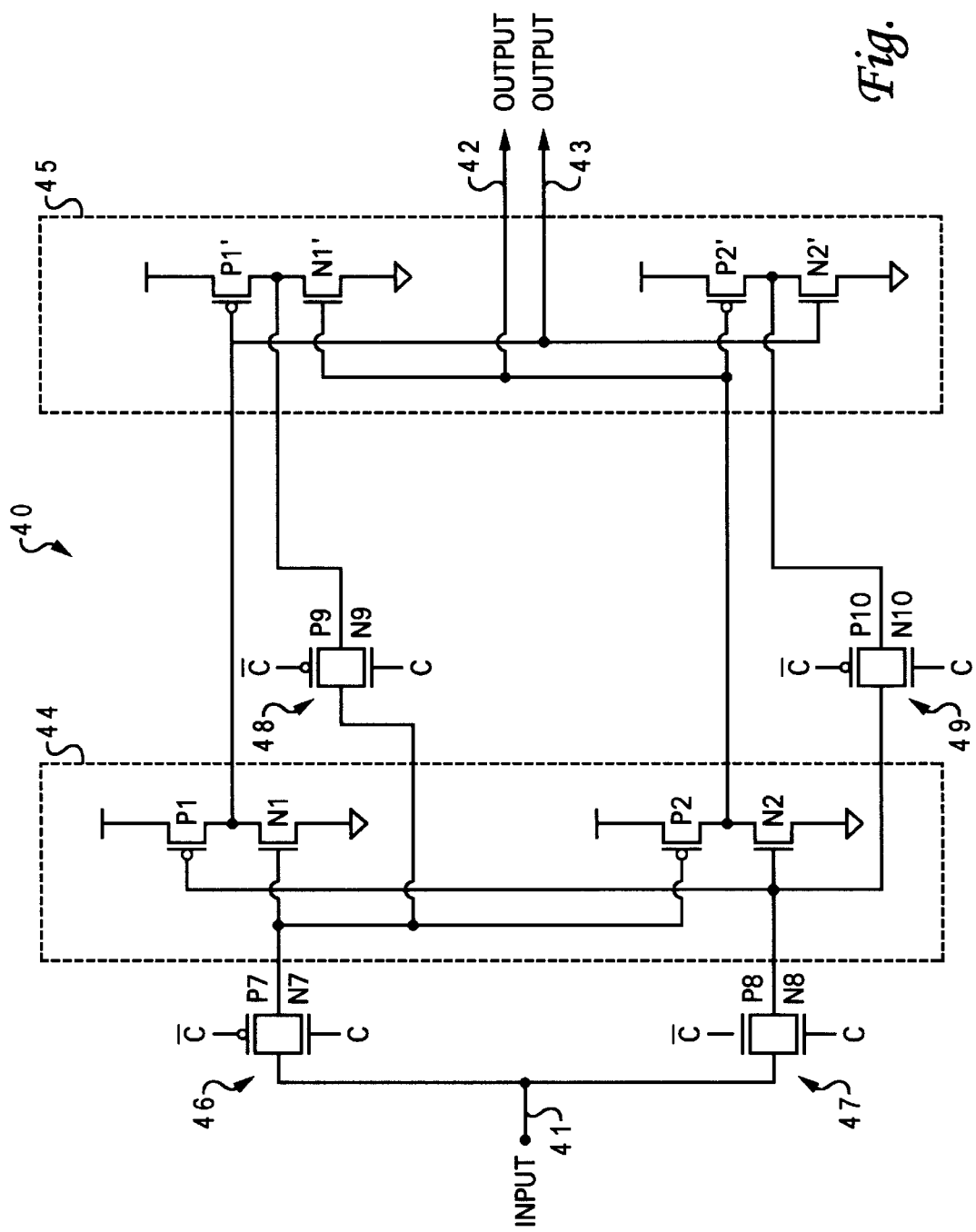
FIG. 4 is a schematic diagram of a single event upset hardened latch circuit, in accordance with a preferred embodiment of the present invention.

With reference now to FIG. 4, there is illustrated a schematic diagram of an SEU hardened latch circuit, in accordance with a preferred embodiment of the present invention. As shown, an SEU hardened latch circuit 40, having an input 41 and outputs 42–43, includes a dual-port inverter 44 and a dual-port inverter 45. Because dual-port inverter 44 and dual-port inverter 45 are identical; thus, only dual-port inverter 44 will be further explained in detail.

Dual-port inverter 44, as illustrated in FIG. 5, includes a first inverter circuit and a second inverter circuit. The first inverter circuit includes a p-channel transistor P1 and an n-channel transistor N1 connected in series. The second inverter circuit includes a p-channel transistor P2 and an n-channel transistor N2 connected in series. A first input (IN1) is connected to the gates of transistors P1 and N2, while a second input (IN2) is connected to the gates of transistors P2 and N1. A first output (OUT1) can be obtained at the node between transistors P1 and N1. A second output (OUT2) can be obtained at the node between transistors P2 and N2. Different combinations of inputs to dual-port inverter 44 provide outputs as follows:

TABLE I

| IN1 | IN2 | OUT1 | OUT2 |
|---|---|---|---|
| 0 | 0 | 1 | 1 |
| 1 | 1 | 0 | 0 |

As shown in Table I, when both inputs IN1 and IN2 are "0," both outputs OUT1 and OUT2 are "1." When both inputs IN1 and IN2 are "1," both outputs OUT1 and OUT2 are "0." Otherwise, when inputs IN1 and IN2 are different, both outputs OUT1 and OUT2 are invalid. Thus, data at both inputs IN1 and IN2 must be the same in order to generate a valid output at either OUT1 or OUT2.

Referring back SEU hardened latch circuit 40 in FIG. 4, input 41 is connected to the first inverter circuit of dual-port inverter 44 and the second inverter circuit of dual-port inverter 44 via a pass gate 46 and a pass gate 47, respectively. Pass gate 46 includes a p-channel transistor P7 and an n-channel transistor N7 connected in parallel. Similarly, pass gate 47 includes a p-channel transistor P8 and an n-channel transistor N8 connected in parallel. The output from pass gate 46 is connected to the gate of transistor N1 from the first inverter circuit of dual-port inverter 44 and the gate of transistor P2 from the second inverter circuit of dual-port inverter 44. Also, the output from pass gate 47 is connected to the gate of transistor P1 from the first inverter circuit of dual-port inverter 44 and the gate of transistor N2 from the second inverter circuit dual-port inverter 44.

The output from pass gate 46 is also connected to the node between transistor P1' and transistor N1' of dual-port inverter 45 via a pass gate 48. Similarly, the output from pass gate 47 is also connected to the node between transistor P2' and transistor N2' of dual-port inverter 45 via a pass gate 49. Pass gate 48 includes a p-channel transistor P9 and an n-channel transistor N9 connected in parallel. Pass gate 49 includes a p-channel transistor P10 and an n-channel transistor N10 connected in parallel.

The output of the first inverter circuit of dual-port inverter 44 is connected to the gate of transistor P1' and the gate of transistor N2' of dual-port inverter 45. The output of the second inverter circuit of dual-port inverter 44 is connected to the gate of transistor N1' and the gate of transistor P2' of dual-port inverter 45. The output of the first inverter circuit of dual-port inverter 44 also provides an output 42. Similarly, the output of the second inverter circuit of dual-port inverter 44 provides an output 43. Both outputs 42 and 43 should generate identical outputs.

During operation, when signal C=1, transmission gates 46 and 47 are turned on while transmission gates 48 and 49 are turned off. Data at input 41 is inverted by dual-port inverter 44 to provide identical outputs at outputs 42 and 43. When signal C=0, transmission gates 46 and 47 are turned off while transmission gates 48 and 49 are turned on. Thus, data path from input 41 is blocked, and data is stored within SEU hardened latch 40.

Figure 6:
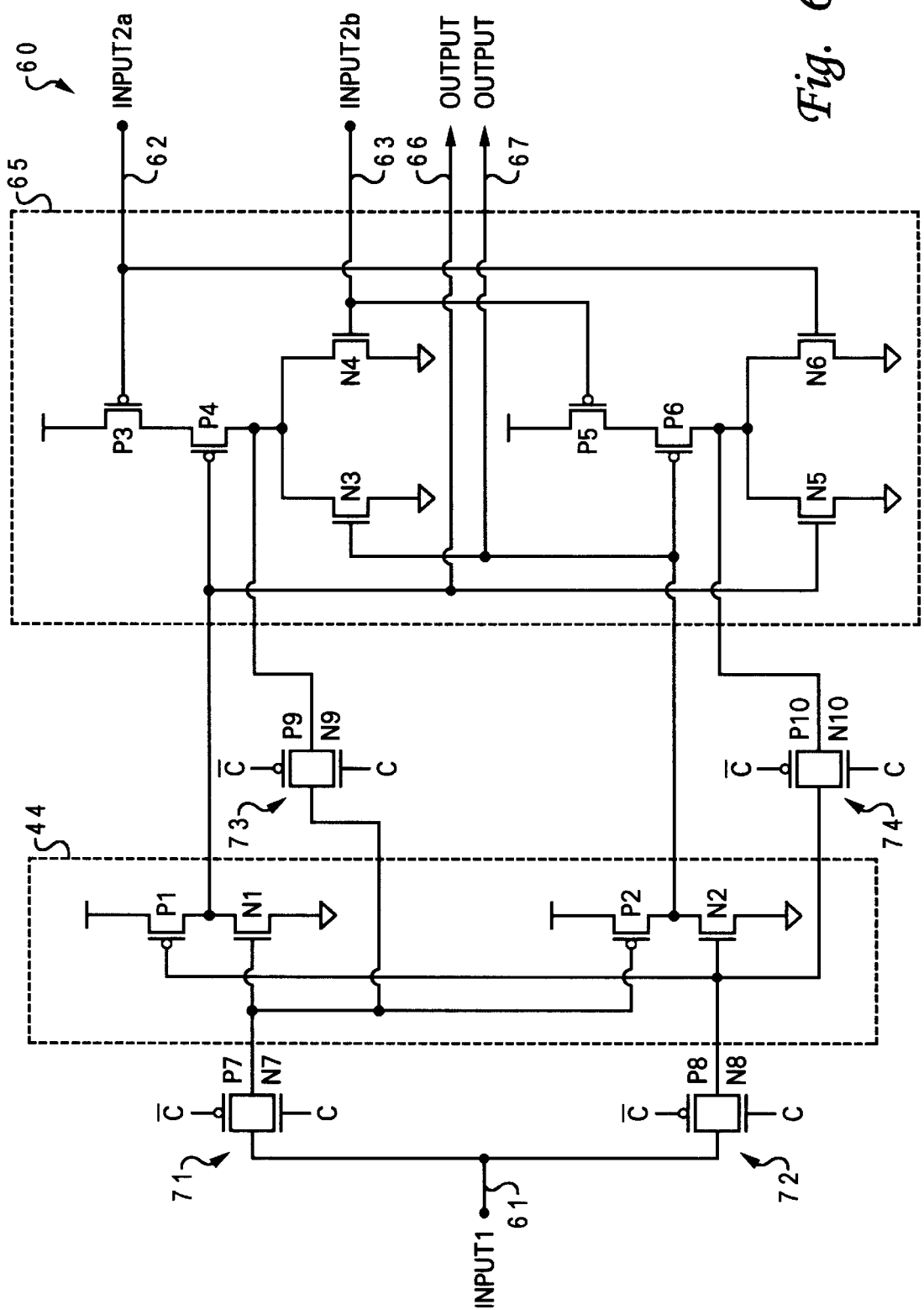
FIG. 6 is a schematic diagram of a single event upset hardened latch circuit, in accordance with an alternative embodiment of the present invention.

With reference now to FIG. 6, there is illustrated a schematic diagram of an SEU hardened latch circuit, in accordance with an alternative embodiment of the present invention. As shown, a latch circuit 60, having inputs 61–63 and outputs 66–67, includes a dual-port inverter 64 and a dual-port logic NOR gate 65.

Figure 7:
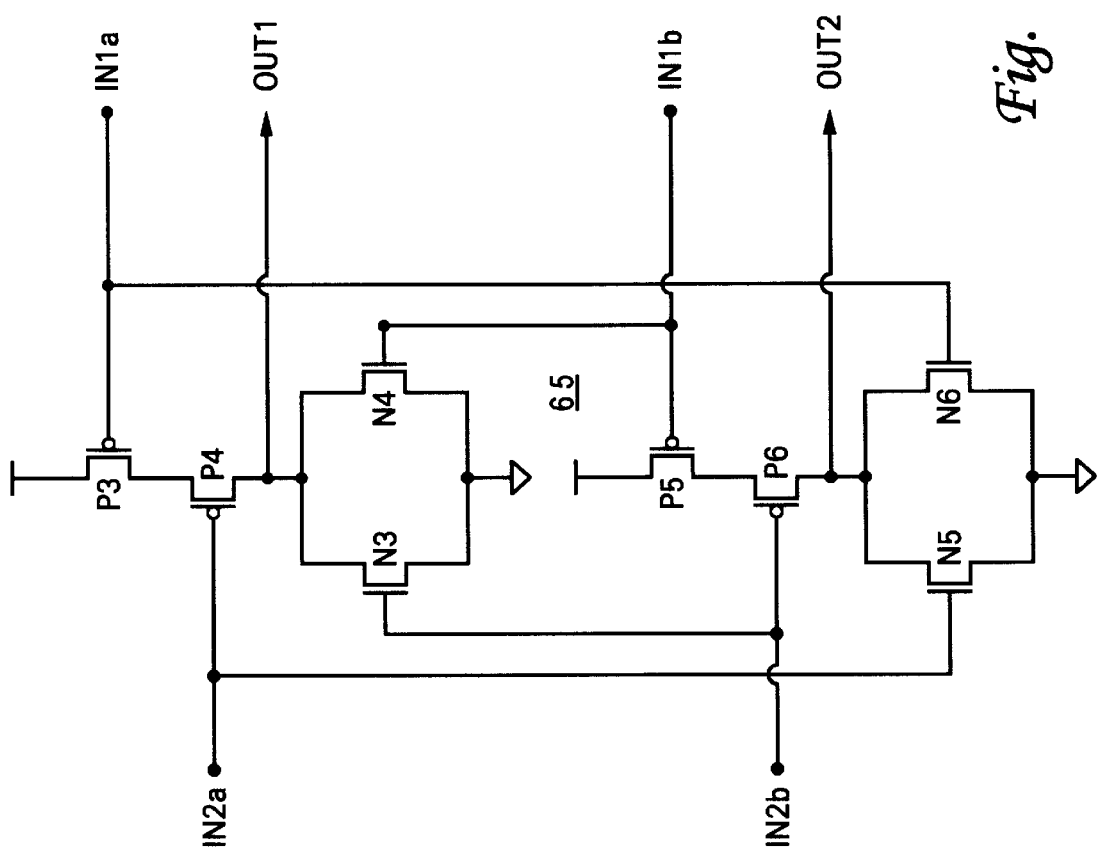
FIG. 7 is a schematic diagram of a dual-port logic NOR gate, in accordance with a preferred embodiment of the present invention.

Dual-port logic NOR gate 65, as illustrated in FIG. 7, includes a first logic NOR circuit and a second logic NOR circuit. The first logic NOR circuit includes two p-channel transistors P3, P4 connected in series with two n-channel transistors N3, N4 connected in parallel. The second logic NOR circuit includes two p-channel transistors P5, P6 connected in series with two n-channel transistors N5, N6 connected in parallel. Dual-port logic NOR gate 65 has two sets of inputs, each set having two separate inputs. The first set of inputs includes IN1*a* IN1*b*, and the second set of inputs includes IN2*a* and IN2*b*. Input IN1*a* is connected to the gates of transistors P3 and N6. Input IN1*b* is connected to the gates of transistors P5 and N4. Input IN2*a* is connected to the gates of transistors P4 and N5. Input IN2*b* is connected to the gates of transistors P6 and N3.

Dual-port logic NOR gate 65 has two outputs—OUT1 and OUT2. The first output OUT1 is connected to the node between transistors P4 and N4. The second output OUT2 is connected to the node between transistors P6 and N6. Different combinations of inputs to dual-port logic NOR circuit 65 provide output as follows:

TABLE II

| IN1a | IN1b | IN2a | IN2b | OUT1 | OUT2 |
|---|---|---|---|---|---|
| 0 | 0 | 0 | 0 | 1 | 1 |
| 0 | 0 | 1 | 1 | 0 | 0 |
| 1 | 1 | 0 | 0 | 0 | 0 |
| 1 | 1 | 1 | 1 | 0 | 0 |

As shown in Table II, when the first set of inputs (IN1*a* and IN2) are "0" and the second set of inputs (IN2*a* and IN2*b*) are "0," both outputs OUT1 and OUT2 are "1." When the first set of inputs (IN1*a* and IN2) are "0" and the second set of inputs (IN2*a* and IN2*b*) are "1," both outputs OUT1 and OUT2 are "0." When the first set of inputs (IN1*a* and IN2) are "1" and the second set of inputs (IN2*a* and IN2*b*) are "0," both outputs OUT1 and OUT2 are "0." When the first set of inputs (IN1*a* and IN2) are "1" and the second set of inputs (IN2*a* and IN2*b*) are "1," both outputs OUT1 and OUT2 are "1." Data at both inputs in each set of inputs must be the same in order to generate a valid output at either OUT1 or OUT2; otherwise, both outputs OUT1 and OUT2 are invalid. Thus, dual-port logic NOR gate 65 behaves like a two-input logic NOR gate with a redundant input for each of the two inputs.

Referring back latch circuit 60 in FIG. 6, input 61 is connected to the first inverter circuit of dual-port inverter 44 and the second inverter circuit of dual-port inverter 44 via a first pass gate and a second pass gate, respectively. The first pass gate includes a p-channel transistor P7 and an n-channel transistor N7 connected in parallel. Similarly, the second pass gate includes a p-channel transistor P8 and an n-channel transistor N8 connected in parallel. The output from the first pass gate is connected to the gate of transistor N1 from the first inverter circuit of dual-port inverter 44 and the gate of transistor P2 from the second inverter circuit of dual-port inverter 44. Also, the output from the second pass gate is connected to the gate of transistor P1 from the first inverter circuit of dual-port inverter 44 and the gate of transistor N2 from the second inverter circuit dual-port inverter 44.

The output from the first pass gate is also connected to the node between transistor P4 and transistor N4 of dual-port inverter 44 via a third pass gate. Similarly, the output from the second pass gate is also connected to the node between transistor P6 and transistor N6 of dual-port inverter 44 via a fourth pass gate. The third pass gate includes a p-channel transistor P9 and an n-channel transistor N9 connected in parallel. The fourth pass gate includes a p-channel transistor P10 and an n-channel transistor N10 connected in parallel.

The output of the first inverter circuit of dual-port inverter 44 is connected to the gate of transistor P4 of the first logic NOR circuit and the gate of transistor N5 of the second logic NOR circuit. The output of the second inverter circuit of dual-port inverter 44 is connected to the gate of transistor N3 of the first logic NOR circuit and the gate of transistor P6 of the second logic NOR circuit. The output of the first inverter circuit of dual-port inverter 44 also provides an output 66 for latch circuit 60. Similarly, the output of the second inverter circuit of dual-port inverter 44 provides an output 67 for latch circuit 60. Both outputs 66 and 67 should generate identical outputs.

Input 62 is connected to the gate of transistor P3 of the first logic NOR circuit and the gate of transistor N6 of the second logic NOR circuit. Input 63 is connected to the gate of transistor N4 of the first logic NOR circuit and the gate of transistor P5 of the second logic NOR circuit. Input 62 and input 63 should receive signals of identical state; that is, both inputs 62 and 63 should both receive either a "1" or "0" at the same time.

During operation, when signal C=1, transmission gates 71 and 72 are turned on while transmission gates 73 and 74 are turned off. Data at input 61 is inverted by dual-port inverter 44 to provide identical outputs at outputs 66 and 67. When signal C=0, transmission gates 71 and 72 are turned off while transmission gates 73 and 74 are turned on. Thus, data path from input 61 is blocked, and data is stored within SEU latch 60. Inputs 62 and 63 can be utilized to change the data stored within SEU latch 60. When outputs 66, 67 are at logical "0," then the data stored within SEU latch 60 can be overridden by providing a logical "1" at inputs 62, 63.

As has been described, the present invention provides an SEU hardened latch circuit. Such SEU hardened latch circuit can be coupled to any type of logic circuit within an integrated circuit devices in ways that are well-known in the art. Although a dual-port logic NOR gate is utilized to illustrate the principle of the present invention, it is understood the dual-port logic NOR gate can be substituted by a similar dual-port logic gate such as a dual-port logic NAND gate, etc.

While the invention has been particularly shown and described with reference to a preferred embodiment, it will be understood by those skilled in the art that various changes in form and detail may be made therein without departing from the spirit and scope of the invention.

What is claimed is:

1. A single event upset hardened latch circuit, comprising:
    a first dual-port inverter for receiving an input, wherein said first input is coupled to said first dual-port inverter via a first set of pass gates;
    a second dual-port inverter coupled to said first dual-port inverter via a second set of pass gates; and
    an output connected to said first dual-port inverter and said second dual-port inverter.

2. The single event upset hardened latch circuit of claim 1, wherein said first dual-port inverter includes a first inverter and a second inverter.

3. The single event upset hardened latch circuit of claim 2, wherein said first inverter includes a first transistor connected to a second transistor in series, and said second inverter includes a third transistor connected to a fourth transistor in series.

4. The single event upset hardened latch circuit of claim 3, wherein a gate of said first transistor is connected to a gate of said fourth transistor to provide a first inverter input, and a gate of said second transistor is connected to a gate of said third transistor to provide a second inverter input.

5. The single event upset hardened latch circuit of claim 4, wherein said first and second transistors provide a first inverter output, and said third and fourth transistors provide a second inverter output.

6. The single event upset hardened latch circuit of claim 5, wherein said first and second inverter inputs receive identical inputs to provide a valid output at either said first inverter output or said second inverter output.

7. The single event upset hardened latch circuit of claim 3, wherein said first and third transistors are p-channel transistors, and said second and fourth transistors are n-channel transistors.

8. The single event upset hardened latch circuit of claim 1, wherein said second dual-port inverter includes a first inverter and a second inverter.

9. The single event upset hardened latch circuit of claim 8, wherein said first inverter includes a first transistor connected to a second transistor in series, and said second inverter includes a third transistor connected to a fourth transistor in series.

10. The single event upset hardened latch circuit of claim 9, wherein a gate of said first transistor is connected to a gate of said fourth transistor to provide a first inverter input, and a gate of said second transistor is connected to a gate of said third transistor to provide a second inverter input.

11. The single event upset hardened latch circuit of claim 10, wherein said first and second transistors provide a first inverter output, and said third and fourth transistors provide a second inverter output.

12. The single event upset hardened latch circuit of claim 11, wherein said first and second inverter inputs receive identical inputs to provide a valid output at either said first inverter output or said second inverter output.

13. The single event upset hardened latch circuit of claim 9, wherein said first and third transistors are p-channel transistors, and said second and fourth transistors are n-channel transistors.

14. A single event upset hardened latch circuit, comprising:
    a dual-port inverter for receiving a first input, wherein said first input is coupled to said dual-port inverter via a first set of pass gates;

a dual-port logic NOR gate for receiving a second input, wherein said dual-port logic NOR gate is coupled to said dual-port inverter via a second set of pass gates; and an output connected to said dual-port inverter and said dual-port logic NOR gate.

15. The single event upset hardened latch circuit of claim 14, wherein said dual-port inverter includes a first inverter and a second inverter.

16. The single event upset hardened latch circuit of claim 15, wherein said first inverter includes a first transistor connected to a second transistor in series, and said second inverter includes a third transistor connected to a fourth transistor in series.

17. The single event upset hardened latch circuit of claim 16, wherein a gate of said first transistor is connected to a gate of said fourth transistor to provide a first inverter input, and a gate of said second transistor is connected to a gate of said third transistor to provide a second inverter input.

18. The single event upset hardened latch circuit of claim 17, wherein said first and second transistors provide a first inverter output, and said third and fourth transistors provide a second inverter output.

19. The single event upset hardened latch circuit of claim 18, wherein said first and second inverter inputs receive identical inputs to provide a valid output at either said first inverter output or said second inverter output.

20. The single event upset hardened latch circuit of claim 16, wherein said first and third transistors are p-channel transistors, and said second and fourth transistors are n-channel transistors.

21. The single event upset hardened latch circuit of claim 14, wherein said dual-port logic NOR gate include a first logic NOR gate and a second logic NOR gate.

22. The single event upset hardened latch circuit of claim 21, wherein said first logic NOR gate includes a fifth and a sixth transistors connected in series and a seventh and an eighth transistors connected in parallel, wherein said second logic NOR gate includes a ninth and a tenth transistors connected in series and an eleventh and a twelfth transistors connected in parallel.

23. The single event upset hardened latch circuit of claim 22, wherein said first logic NOR gate receives a first and a second logic NOR gate inputs to provide a first logic NOR gate output, and said second logic NOR gate receives a third and a fourth logic NOR gate inputs to provide a second logic NOR gate output.

24. The single event upset hardened latch circuit of claim 23, wherein said first and third logic NOR gate inputs receive identical inputs and said second and fourth logic NOR gate inputs receive identical inputs to provide a valid output at either said first logic NOR gate output or said second logic NOR gate output.

25. The single event upset hardened latch circuit of claim 24, wherein said fifth, sixth, ninth, and tenth transistors are p-channel transistors, wherein said seventh, eighth, eleventh, and twelfth transistors are n-channel transistors.

* * * * *